FREQUENCY CONTROLLED OSCILLATOR

Filed June 30, 1960 2 Sheets-Sheet 1

INVENTOR.
JAMES A. LAPOINTE
BY Herbert W. Arnold
ATTORNEY

INVENTOR.
JAMES A. LAPOINTE
BY Herbert W. Arnold
ATTORNEY

United States Patent Office 3,127,577

Patented Mar. 31, 1964

3,127,577

FREQUENCY CONTROLLED OSCILLATOR

James A. Lapointe, Peabody, Mass., assignor to Raytheon Company, Lexington, Mass., a corporation of Delaware Filed June 30, 1960, Ser. No. 40,043
8 Claims. (Cl. 332—29)

The present invention relates to an electronic oscillator system, and more particularly to a system wherein the frequency of a Wien bridge oscillator may be changed or modulated over a wide frequency band with an improved linearity factor.

One particular application of the present invention is in the field of a local oscillator arrangement utilized with radio receiver equipment. However, the principles of the invention are equally applicable to other oscillator uses in which the frequency of the basic oscillator circuit is to be varied either by way of a modulation factor representative of an input signal or alternatively as a means of sweeping or tuning the basic oscillator frequency over a wide and linear range of values.

A principal object of the present invention is therefore to provide a local oscillator arrangement which is tunable by means of a simplified reactance bridge circuit over a wide and linear frequency range.

A further object of the invention is to provide an improved modulated oscillator of simplified electrical and mechanical configuration by the novel use of semiconductor devices.

An additional object of the invention is to provide a frequency modulated oscillator arrangement possessing inherent linearity capabilities as limited only by the particular semi-conductor device utilized for a variable impedance component.

A further and additional object of the invention is to provide an oscillator arrangement of the Wien bridge type wherein the oscillation frequency may be modulated over a wide linear range in either the audio frequency or radio frequency spectrum.

Prior art circuits have recognized the basic arrangement of a Wien bridge oscillator for frequency modulation systems. It should however be noted that most prior arrangements known to the inventor have utilized reactance tubes or electronic circuit elements of the filamentary type which are subject to inherent instability due to heating, aging, and environmental conditions of temperature and gravitational forces. Such known systems have utilized electron tubes of the evacuated type having a heated cathode or electron emitter for both the oscillator circuit, which circuit is of the type utilizing a feedback amplifier of the regenerative type, and as the variable impedance element of a frequency determining reactance bridge wherein at least a portion of the bridge is included in the feedback loop of such amplifier. It should be realized, however, that the device of the present invention, while possessing several advantages over the prior art vacuum tube systems as to size, weight and stability, has a further advantage of improved linearity, all due to the use therein of semiconductor elements.

As the description of a preferred embodiment of the invention proceeds, it will thus become apparent that the novel circuit arrangement thereof is not merely a substitution of transistorized or semiconductor elements for the vacuum tube equivalents of the prior art under the recognized theory of duality, but rather that the utilization of semiconductor devices results in an arrangement of greatly improved stability over a wide range of linear oscillator operation. The novel features characteristic of the invention are set forth with particularity in the appended claims. The invention itself, however, both as to its organization and its method of operation together with additional objects and advantages thereof, will best be understood from the following description of a specific embodiment when read in connection with the accompanying drawings, in which:

The basic circuit of the invention is an oscillator whose frequency may be modulated by a control input signal of audio or video properties in order to provide intelligence, or alternatively the modulation input may be in the form of a tuning control or command signal which may vary the oscillator frequency over a wide and linear range in either the audio or radio frequency spectrums. Such a modulatable or tunable oscillator has wide application in many military and commercial equipment fields. For example, a frequency modulated oscillator of this type may be utilized as the local oscillator for two-way communication systems, television and telemetering systems, remote control monitoring, or guidance systems. Also the tunable oscillator of this invention has applications in tunable radio frequency systems in the radar field, for example; as well as independent use as a tunable lower frequency sweep generator, and as a system component as in sonar and geophysical exploration arrangements.

Figure 1:
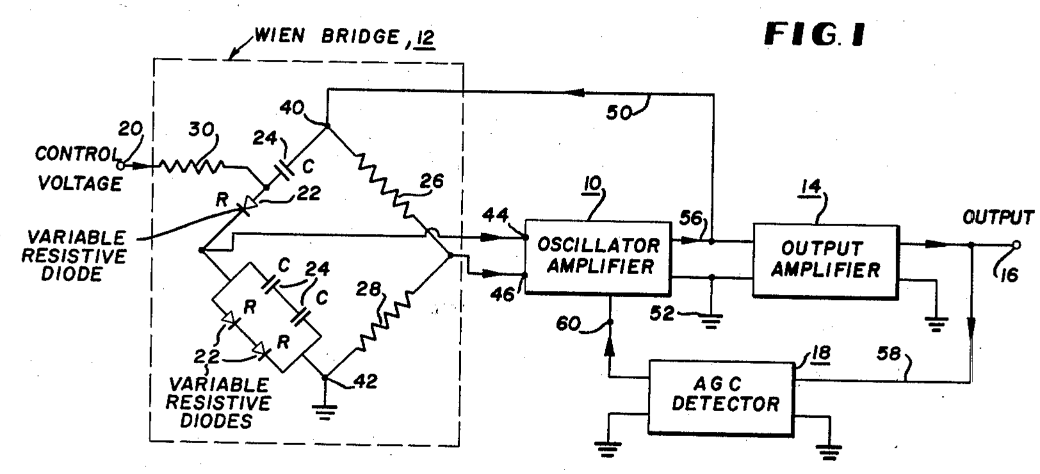
FIGURE 1 is a schematic representation in partial block diagram form of the tunable oscillator of the present invention.

The arrangement of FIGURE 1 includes an amplifier 10 of the regenerative type which functions as the oscillator whose frequency is controlled. The frequency of oscillator-amplifier 10 is determined and controlled by means of the familiar Wien bridge arrangement 12 which is included in a feedback loop of such amplifier. The output from the oscillator-amplifier 10 is taken through an output amplifier 14 which is provided in order to prevent loading of element 10 as well as to provide a low impedance output voltage of suitable magnitude at the terminal 16. An AGC detector circuit 18 is provided between the output terminal 16 and the oscillator-amplifier 10 in order to control the gain of the latter element so as to keep the output terminal voltage constant as the oscillator frequency is varied over a wide band or range.

In accordance with well-known theory the frequency of operation of oscillator-amplifier 10 may be shown to be:

$$f=\frac{1}{2\pi RC} \qquad \text{(Equation 1)}$$

The values of R and C are those of the bridge components 22 and 24, respectively, as indicated in the complete Wien bridge 12, which bridge arrangement is completed by the resistor elements 26 and 28, as indicated in FIGURE 1. The frequency of operation of the oscillator combination is varied or modulated by varying the value of the resistors R while the capacitors C are held constant.

An important feature of the invention resides in the arrangement wherein the variable impedance of the bridge used to control the oscillation frequency is the forward dynamic impedance of a particular type of semiconductor diode which has the characteristic of:

$$R=\frac{K}{I} \qquad \text{(Equation 2)}$$

where I is the diode current. In such an arrangement the term R may be varied over a 10-to-1 range. Substituting the value of R from Equation 2 in the basic frequency-determining Equation 1, the resultant oscillator control function will be apparent from the following equation:

$$F=\frac{I}{2\pi CK}=K_1I \qquad \text{(Equation 3)}$$

wherein K and $K_1$ are constants. The value of such constants are determined by the functional characteristics of the particular semiconductor diode utilized, as will become more apparent in connection with the graph of FIGURE 3.

A control voltage or tuning or command signal is applied to the frequency-determining bridge 12 at the terminal 20 thereof. In order to make the oscillator frequency a linear function of this control voltage, a constant current generator is required, and the inclusion of a series resistor 30 of large magnitude between the control voltage source 20 and the controlled diodes 22 assures such a function.

Figure 3:
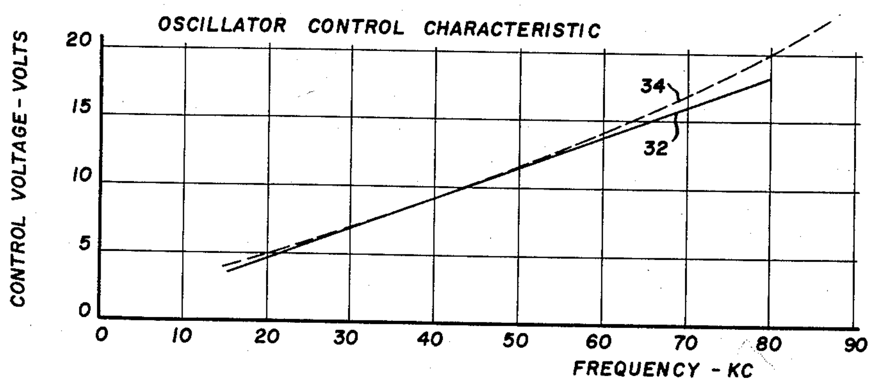
FIGURE 3 is a graph representative of a particular characteristic or function of a semiconductor element utilized in the invention.

The particular oscillator frequency control characteristic which is necessary in order to carry out the present invention is shown graphically in FIGURE 3 wherein the solid curve 32 represents the optimum theoretical characteristic and the dashed-curve 34 shows the characteristic in accordance with the semiconductor element utilized in the present invention. In FIGURE 3 the output frequency of the oscillator is indicated on the horizontal axis, and the numerical values of such frequency, in one embodiment constructed in accordance with the invention, are expressed in kilocycles per second. The vertical axis of FIGURE 3 represents units of amplitude of control voltage input as applied at the terminal 20, and in the same embodiment such units are expressed in volts.

Figure 4:
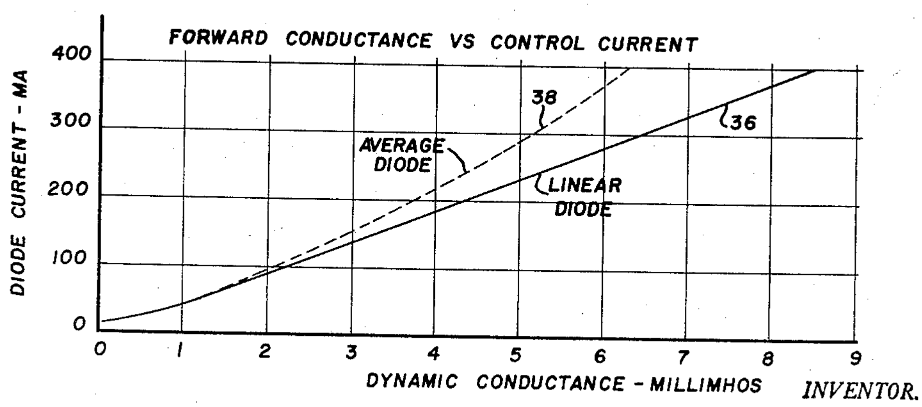
FIGURE 4 is an additional graph representative of a particular mode of operation of such semiconductor element according to the inventive concept.

A particular semiconductor diode which possesses the required characteristic of $$R=\frac{K}{I}$$

may be selected from a particular type of silicon diode, which type is characterized by a very low saturation current. In FIGURE 4, the graph compares the linear characteristic of this type of silicon diode with a diode having a saturation current about one hundred times larger. Thus, line 36 shows the characteristic of the preferred type of silicon diode while the curved line 38 indicates the relatively non-linear characteristic of other diode types having higher saturation current values. In FIGURE 4, the forward dynamic conductance or reciprocal resistance expressed in mhos is plotted on the horizontal axis while the diode current is indicated on the vertical axis, so that a linear rather than a reciprocal curve may be shown. In one embodiment of the oscillator constructed in accordance with the invention, the value of the horizontal axis reciprocal resistance magnitudes are expressed in millimhos; while the diode control current which varied the such forward diode conductance is shown on the vertical axis in milliamperes.

By comparison of the graphical representations of FIGURES 3 and 4 it will be readily apparent that the advantage of the present invention is augmented to a great extent by the resultant wide range of linear operation. Thus, the oscillator system of the invention has the inherent capability of linearity which is limited only by the diode characteristics. Such limitation does not appear to be significant until frequency modulation or tuning of the oscillator 10 is required over a wide range as expressed by Equation 2 wherein the value of R is to be varied over a 10-to-1 range. It has been found that by the use of a semiconductor diode whose forward dynamic impedance is varied in value to serve as the element R of the Wien bridge, the linear oscillator operation may be secured over a range of 4:1 to 10:1, which linearity range is at least three times better than prior art circuits utilizing inductance-capacitance resonant tanks and a variable reactance vacuum tube.

Figures 2, 5:
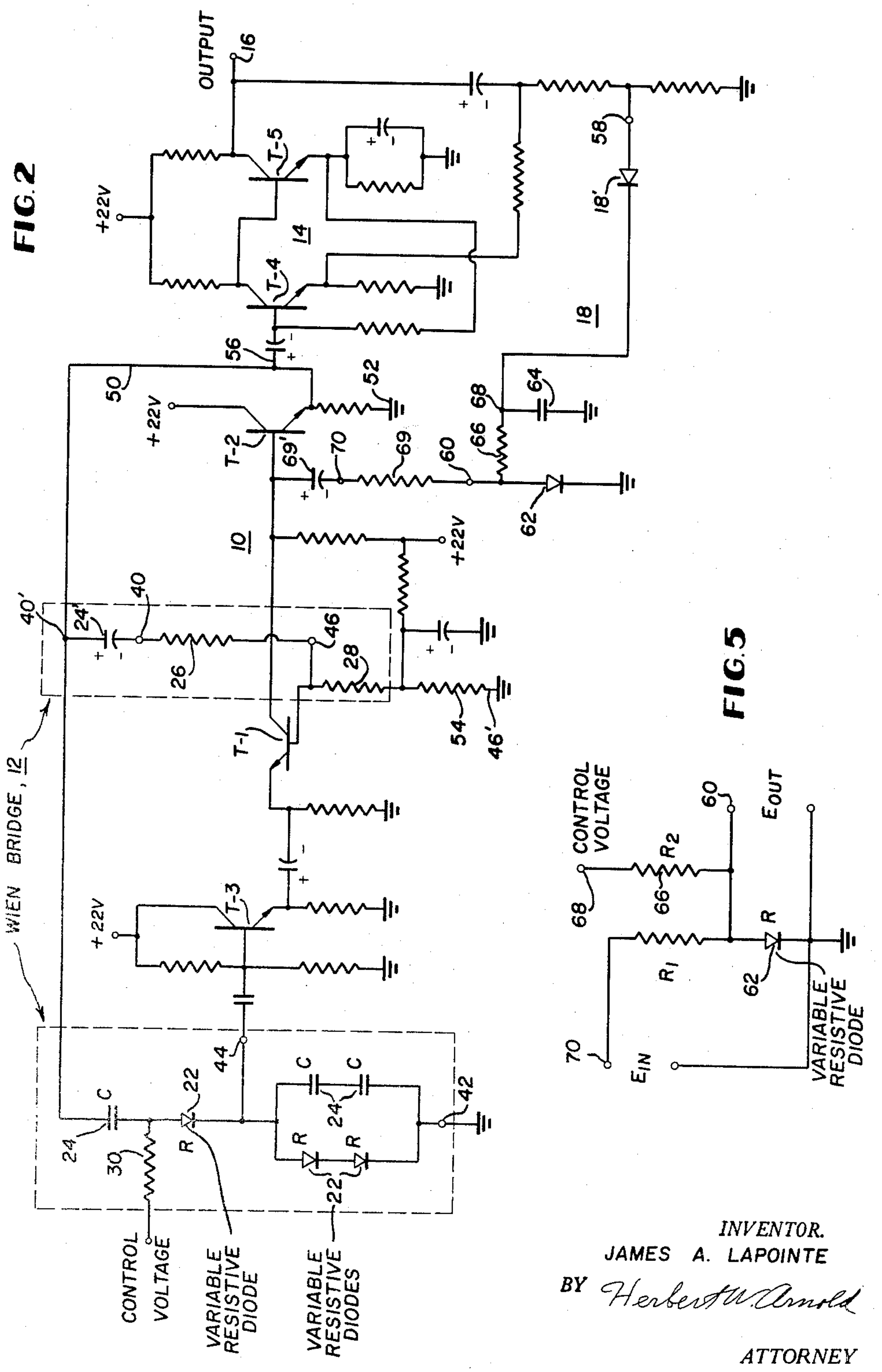
FIGURE 2 is an electrical schematic diagram of a preferred embodiment.
FIGURE 5 is an electrical schematic diagram of a modified application of the principles of the invention utilized in connection with a portion of FIGURE 2.

A preferred embodiment of the variable frequency oscillator of the present invention is indicated in FIGURE 2. The Wien bridge arrangement is indicated within the dotted line areas, and such bridge which controls the reactance and therefore the frequency of the feedback oscillator-amplifier 10 is, as indicated in the basic FIGURE 1, the means 12. Bridge elements 22, 24, 26, and 28, as shown in FIGURE 1, are similarly identified in the embodiment of FIGURE 2, as well as the series resistor 30 of large magnitude used with the bridge, in order to present a constant current generator source when the control voltage is applied to the terminal 20. It will be noted that the bridge 12, as indicated in FIGURE 1, has a so-called pair of input or "generator" terminals 40 and 42 across one diagonal of the bridge and a pair of output or "meter" terminals 44 and 46 across the other bridge diagonal. The feedback loop 50 is applied to bridge terminal 40 and its return path is by means of the ground connection indicated symbolically at bridge terminal 42 and output terminal 52 of the oscillator-amplifier 10. The variable reactance effect of bridge 12 is thus included in the feedback loop, and the output from the bridge terminals 44 and 46 are fed back as an input to the oscillator-amplifier 10.

In the specific circuit arrangement of FIGURE 2, such bridge terminals 40, 42, 44 and 46 are identified where they coincide exactly with such terminals or connection points of FIGURE 1. In addition, junction points or terminations 40′ and 46′ are indicated in FIGURE 2. In FIGURE 2, the oscillator-amplifier 10 includes the transistors T–1 and T–2, which with their associated circuit elements provide a two-stage amplifier of suitable gain and phase relationship in order to function as a regenerative oscillator-amplifier embodying a degenerative feedback path having a frequency-determining bridge 12 therein. In order to provide the proper biasing on the base of transistor T–1, the resistor 54 has been included between the bridge resistor 28 and the ground connection. Resistor 54 is connected at one end to both the transistor base and to the terminal 46, and the other end thereof is returned to "ground" as indicated by the usual circuit symbol at the connection point 46′.

In order to provide the necessary D.C. isolation for the bias of the transistors, the termination 40′ as indicated between the pair of upper condensers 24 and 24′ has been included in the feedback path 50. An additional condenser 24′ is shown in FIGURE 2 which is not indicated in FIGURE 1. Such upper right-hand condenser 24′ functions as the D.C. isolating or blocking means.

The input to the transistor oscillator-amplifier 10 of FIGURE 2 is by means of a third transistor T–3 which has been included for purposes of necessary isolation and impedance matching to prevent loading down of bridge 12.

The output from oscillator-amplifier 10 is taken at terminals 56 and 52, as indicated in FIGURE 2, and is fed into the output amplifier 14, which consists of the pair of cascaded transistors T–4 and T–5 together with their associated resistive circuit biasing elements, shown in FIGURE 2. Such output amplifier arrangement provides a low output impedance and a large magnitude output voltage to the terminal 16, and also serves to prevent loading of the oscillator-amplifier 10.

It will be noted that a portion of the output of the modulated oscillator arrangement is taken on lead 58 and fed back to the AGC detector means 18 as shown in FIGURES 1 and 2. In the latter figure the semiconductor diode member 18′ serves as the detector and the D.C. output voltage thereof is passed through resistor 66 to provide a direct current for diode 62 to control its dynamic impedance. Diode 62 and resistor 69 form a controlled attenuator network which is connected to transistor T–2 by the D.C. isolating capacitor 69′, in order to control the gain of amplifier 10 to keep the voltage constant at output terminal 16 as the oscillator frequency is varied. A novel arrangement for controlling this AGC gain level is provided by means which includes an additional semiconductor diode 62 shown in FIGURE 2.

By utilizing the forward dynamic impedance of diode 62 as one of the members of the voltage-divider network in the AGC detector load, an improved variable attenuation arrangement is provided in accordance with the principles of this invention. Reference will now be made to FIGURE 5 for an explanation of the theory of such variable attenuation action. FIGURE 5 represents an idealized or equivalent circuit diagram. Neglecting for a moment the effect of the terminal marked "control voltage" and the resistor $R_2$ indicated in this figure, it will be apparent that the output voltage $E_{out}$ will be proportional to the input voltage $E_{in}$ in an amount as determined by the voltage-divider action of the series-connected impedances $R_1$ and R. Such a relationship is expressed by the equation:

$$E_{out}=\frac{R}{R+R_1}E_{in} \qquad \text{(Equation 4)}$$

Since the factor R in the above equation is represented by the forward dynamic impedance of the semiconductor diode 62, which forward dynamic impedance is proportional to the current through the diode as expressed in Equation 2 above, wherein $$R=\frac{K}{I}$$

such value of R may be substituted in Equation 4 which gives:

$$E_{out}=\frac{K}{K+R_1 I}E_{in} \qquad \text{(Equation 5)}$$

Equation 5 reduces to the following equation, wherein it will be seen that the voltage-divided value of the output voltage is determined in part by the value of the control current I which flows through the semiconductor diode 62:

$$E_{out}=\frac{E_{in}}{1+\frac{R_1}{KI}} \qquad \text{(Equation 6)}$$

The value of the diode current I which controls the forward dynamic impedance of the diode is varied by the application of a control voltage in accordance with this invention. As previously explained in connection with FIGURES 1 and 2 a control voltage may be applied as at terminal 68 in FIGURE 5, and a large impedance, indicated as $R_2$ in FIGURE 5, should be used in order to secure a constant current generator effect. By varying the control voltage applied to terminal 68 the forward dynamic impedance R of the semiconductor diode 62 may be controlled in order to variably attenuate the output voltage from the voltage-divider network.

The actual variable attenuation circuit as incorporated in FIGURE 2 differs from the idealized arrangement shown in FIGURE 5 in that controlled attenuation of the signal voltage into transistor T–2 is accomplished by the loading effect of the impedance of resistor 69 plus diode 62 which partially shunt this input to ground. Thus, the magnitude of the input voltage applied at terminal 68 (FIG. 2 or 6) controls the current through the semiconductor diode 62 and thus the variable attenuation effect thereof as provided by the variable forward dynamic resistance of such diode. Thus, if the value of the input voltage applied to terminal 68 as developed by the AGC detector 18' rises to too large a magnitude, then the attenuation effect of the diode element 62 will accordingly increase so as to suitably reduce the value of the output voltage of transistor T–2.

It will be appreciated by those skilled in the art that the complete circuit diagram of FIGURE 2 includes such suitable and necessary biasing resistances and voltage sources as are usually provided in a transistor amplifier circuit. Thus, in accordance with known practice, each transistor stage is provided with a suitable source of energizing potential as indicated by the legend "+22 V" shown in the figure, and the necessary resistor and capacitor biasing elements for each transistor stage are indicated in the diagram, although no reference numeral or circuit values therefor are shown.

While certain particular embodiments of the invention have been disclosed and described herein, various changes and modifications may be made therein without departing from the spirit and scope of the invention.

What is claimed is:

1. In combination, a generator of electrical oscillations, a frequency-determining Wien bridge network for said generator, said network including an impedance having a value which varies with the current flowing therethrough, and means for continuously varying the current flow through said impedance and holding the capacitance of said network substantially constant to linearly vary the frequency of the generated oscillations.

2. A source of frequency-modulated oscillation comprising a generator of oscillations including a frequency-determining network, said network including an impedance having a value which varies with the current flowing therethrough and a capacitance which remains substantially constant, and means for continuously varying the current flow through said impedance to modulate the frequency of the generated oscillations.

3. A variable frequency oscillation generator including, in combination, a regenerative oscillator having at least one frequency determining feedback path, a reactive network in said feedback path, said network including a semiconductor means having an impedance value which varies with the current flowing therethrough while said capacitance portion of said reactance is held substantially constant, and means for continuously varying the current flow through said semiconductor means to linearly vary the frequency of the generated oscillations.

4. A variable frequency oscillation generator including, in combination, an amplifier having a first regenerative feedback path to sustain continuous electrical oscillations, said amplifier having at least one further feedback path, a frequency-determining network in one of said feedback paths, said network including an impedance, the value of which varies with the current flowing therethrough while the capacitance of said network is held substantially constant, and means for continuously varying the current flow through said impedance to linearly vary the frequency of the generated oscillations.

5. A variable frequency oscillation generator including, in combination, a resistance-capacitance amplifier having a first regenerative feedback path to provide sustained electrical oscillations, a second degenerative feedback path, a frequency-determining reactive network in one of said paths, said network including a semiconductor means, forward dynamic impedance of which varies with the current flowing therethrough and the capacitance of said network being held substantially constant, and means for continuously varying the current flow through said semiconductor means to linearly vary the frequency of the generated oscillations.

6. A variable frequency oscillator generator including, in combination, a regenerative resistance-capacitance amplifier having at least one frequency determining feedback path, a Wien bridge network in said feedback path, said network including an impedance having a value which varies with the current flowing therethrough, and means for continuously varying the current flow through said impedance while simultaneously holding the capacitance of said network substantially constant to vary the frequency of the generated oscillations.

7. A variable frequency transistor oscillation generator including, in combination, a resistance-capacitance amplifier having at least one regenerative feedback path to produce sustained electrical oscillations, said amplifier including at least one additional feed path, a frequency-determining network in one of said feedback paths, said network including a semiconductor diode, the forward dynamic impedance of which varies with the current flowing therethrough the capacitance thereof remaining substantially constant, and means for continuously varying the current flow through said semiconductor diode to linearly vary the frequency of the generated oscillations.

8. A transistor oscillation generator as defined in claim 7 and further including output means for the generated oscillations and means for automatically controlling the level of the output oscillations and maintaining the same substantially constant when the output frequency is varied.

References Cited in the file of this patent

UNITED STATES PATENTS

| | | |
|---|---|---|
| 2,583,138 | Carter et al. | Jan. 22, 1952 |
| 2,588,551 | McCoy | Mar. 11, 1952 |
| 2,704,330 | Marker | Mar. 15, 1955 |
| 2,730,620 | Schmitt et al. | Jan. 10, 1956 |
| 2,776,372 | Ensink et al. | Jan. 1, 1957 |
| 2,930,992 | Rawlins et al. | Mar. 29, 1960 |
| 3,031,627 | Reichert et al. | Apr. 24, 1962 |
| 3,048,796 | Snow et al. | Aug. 7, 1962 |
| 3,061,802 | Westneat | Oct. 30, 1962 |